United States Patent
Wang et al.

(10) Patent No.: US 11,545,574 B2
(45) Date of Patent: Jan. 3, 2023

(54) SINGLE DIFFUSION BREAKS INCLUDING STACKED DIELECTRIC LAYERS

(71) Applicant: GLOBALFOUNDRIES U.S. Inc., Santa Clara, CA (US)

(72) Inventors: Haiting Wang, Clifton Park, NY (US); Rinus Lee, Malta, NY (US); Sipeng Gu, Clifton Park, NY (US); Yue Hu, Mechanicville, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 324 days.

(21) Appl. No.: 16/994,915

(22) Filed: Aug. 17, 2020

(65) Prior Publication Data

US 2022/0052193 A1 Feb. 17, 2022

(51) Int. Cl.
*H01L 21/8234* (2006.01)
*H01L 29/78* (2006.01)
*H01L 29/06* (2006.01)
*H01L 29/66* (2006.01)

(52) U.S. Cl.
CPC .... *H01L 29/785* (2013.01); *H01L 21/823431* (2013.01); *H01L 29/0653* (2013.01); *H01L 29/66545* (2013.01)

(58) Field of Classification Search
None
See application file for complete search history.

(56) References Cited

U.S. PATENT DOCUMENTS

| | | |
|---|---|---|
| 8,846,491 B1 | 9/2014 | Pham et al. |
| 8,916,460 B1 | 12/2014 | Kwon et al. |
| 9,123,773 B1 | 9/2015 | Shen et al. |
| 9,368,496 B1 | 6/2016 | Yu et al. |
| 2017/0278925 A1 | 9/2017 | Peng et al. |
| 2020/0161419 A1* | 5/2020 | Yang ................ H01L 29/66545 |
| 2020/0203231 A1* | 6/2020 | Hsu ................ H01L 21/823431 |

* cited by examiner

*Primary Examiner* — Joseph C. Nicely
*Assistant Examiner* — Lamont B Koo
(74) *Attorney, Agent, or Firm* — Thompson Hine LLP; Francois Pagette

(57) ABSTRACT

Structures for a single diffusion break and methods of forming a structure for a single diffusion break. A cut is formed in a semiconductor fin. A single diffusion break includes a first dielectric layer in the cut and a second dielectric layer over the first dielectric layer. The first dielectric layer is comprised of a first material, and the second dielectric layer is comprised of a second material having a different composition than the first material. The second dielectric layer includes a first portion over the first dielectric layer and a second portion over the first portion. The first portion of the second dielectric layer has a first horizontal dimension, and the second portion of the second dielectric layer has a second horizontal dimension that is greater than the first horizontal dimension.

20 Claims, 8 Drawing Sheets

SINGLE DIFFUSION BREAKS INCLUDING STACKED DIELECTRIC LAYERS

BACKGROUND

The invention relates to semiconductor device fabrication and integrated circuits and, more specifically, to structures for a single diffusion break and methods of forming a structure for a single diffusion break.

Complementary-metal-oxide-semiconductor (CMOS) processes may be used to build a combination of p-type and n-type field-effect transistors that are used to construct, for example, logic cells. Field-effect transistors generally include a semiconductor body supplying a channel region, a source, a drain, and a gate electrode over the channel region. When a control voltage exceeding a characteristic threshold voltage is applied to the gate electrode, carrier flow occurs in the channel region between the source and drain to produce a device output current.

A fin-type field-effect transistor (FinFET) may include a fin providing the semiconductor body, a gate structure that wraps about the top and sides of the fin, and heavily-doped source and drain regions spaced along the fin and arranged on opposite sides of the gate structure. A lower portion of the fin is embedded in dielectric material and an upper portion of the fin is overlapped by the gate structure. The source and drain regions may be formed in cavities that are etched in the fin.

Single diffusion breaks may be used to electrically isolate different transistors or groups of transistor from each other. Part of the process used to form a single diffusion break involves forming a cut in a fin, depositing a dielectric material that fills the cut, and recessing the dielectric material. An upper portion of the fin may exhibit unwanted rounding produced by the etching processes used to form the single diffusion break. Process modifications to eliminate fin rounding may place limitations and restrictions on the formation of a single diffusion break.

Improved structures for a single diffusion break and methods of forming a structure for a single diffusion break are needed.

SUMMARY

In an embodiment of the invention, a structure includes a semiconductor fin including a cut, and a single diffusion break including a first dielectric layer in the cut and a second dielectric layer over the first dielectric layer. The first dielectric layer is comprised of a first material, and the second dielectric layer is comprised of a second material having a different composition than the first material. The second dielectric layer includes a first portion over the first dielectric layer and a second portion over the first portion. The first portion of the second dielectric layer has a first horizontal dimension, and the second portion of the second dielectric layer has a second horizontal dimension that is greater than the first horizontal dimension.

In an embodiment of the invention, a method includes forming a cut in a semiconductor fin, and forming a single diffusion break including a first dielectric layer in the cut and a second dielectric layer over the first dielectric layer. The first dielectric layer is comprised of a first material, and the second dielectric layer is comprised of a second material having a different composition than the first material. The second dielectric layer includes a first portion over the first dielectric layer and a second portion over the first portion, the first portion of the second dielectric layer has a first horizontal dimension, and the second portion of the second dielectric layer has a second horizontal dimension that is greater than the first horizontal dimension.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
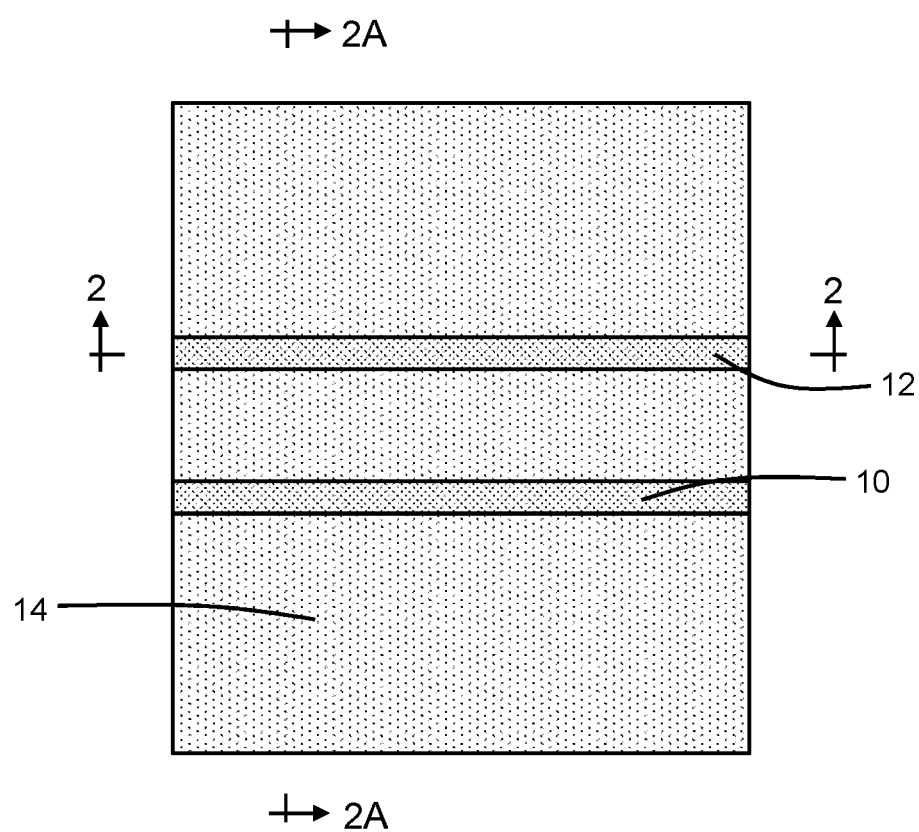
FIG. 1 is a top view of a structure at an initial fabrication stage of a processing method in accordance with embodiments of the invention.
Figure 2:
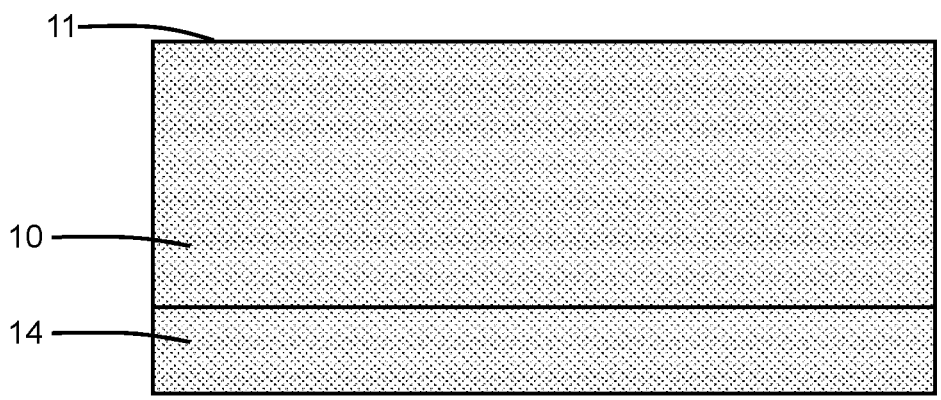
FIG. 2 is a cross-sectional view taken generally along line 2-2 in FIG. 1.
Figure 2A:
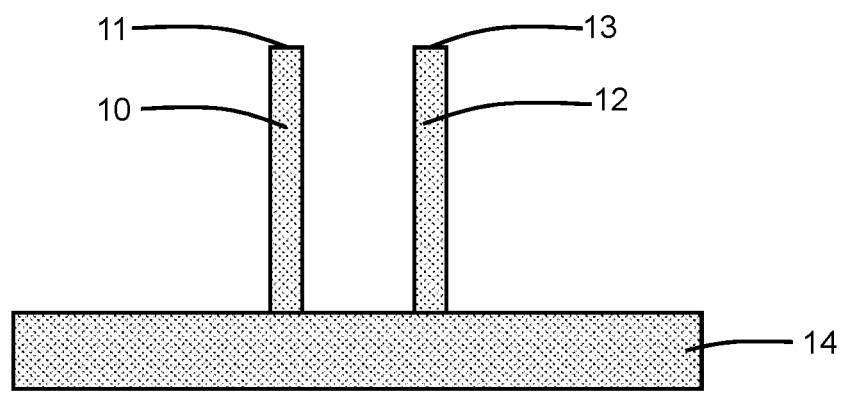
FIG. 2A is a cross-sectional view taken generally along line 2A-2A in FIG. 1.

With reference to FIGS. 1, 2, 2A and in accordance with embodiments of the invention, a structure 60 includes semiconductor fins 10, 12 that are arranged over, and project upwardly away from, a semiconductor substrate 14. The semiconductor fins 10, 12 and the semiconductor substrate 14 may be comprised of a single-crystal semiconductor material, such as single-crystal silicon. The semiconductor fins 10, 12 may be formed by patterning the semiconductor substrate 14 with lithography and etching processes or by a self-aligned multi-patterning process. The semiconductor fins 10, 12 extend along respective longitudinal axes with a parallel or substantially parallel relationship. The semiconductor fin 10 has a top surface 11, and the semiconductor fin 12 has a top surface 13 that may be coplanar or substantially coplanar with the top surface 11.

Figure 3:
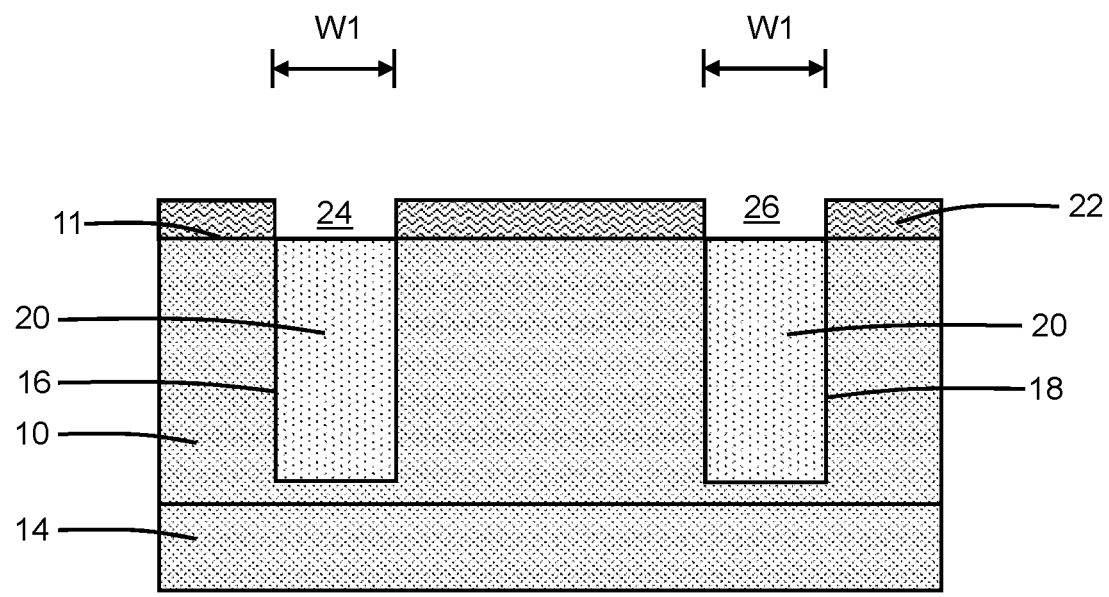
FIGS. 3, 3A are cross-sectional views of the structure at a fabrication stage of the processing method subsequent to FIGS. 2, 2A.
Figure 3A:
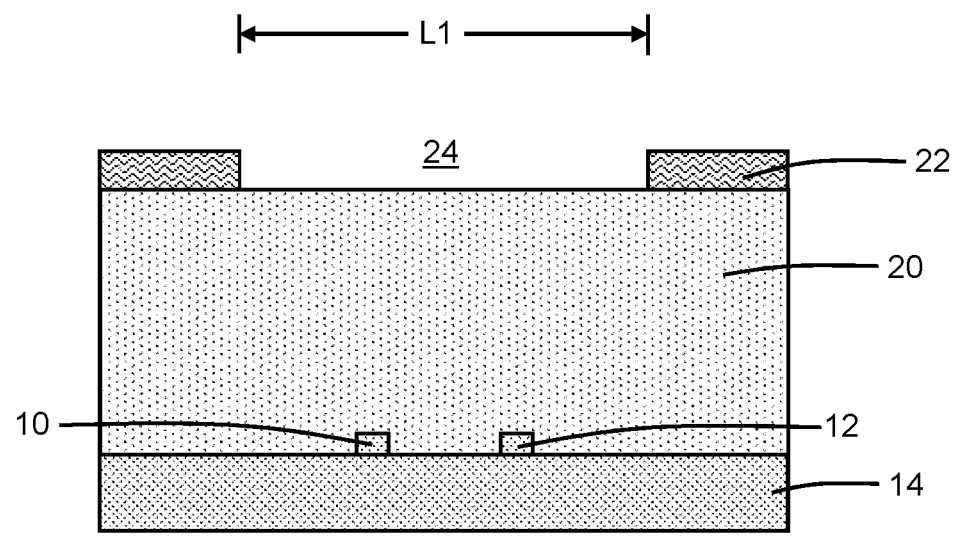

With reference to FIGS. 3, 3A in which like reference numerals refer to like features in FIGS. 2, 2A and at a subsequent fabrication stage of the processing method, cuts 16, 18 for single diffusion breaks are formed in the semiconductor fins 10, 12 at locations along their respective longitudinal axes. The cuts 16, 18 may be formed by lithography and etching processes that remove portions of the semiconductor fins 10, 12 at the locations of the cuts 16, 18. A dielectric layer 20 is deposited and planarized by chemical mechanical polishing to expose the top surfaces 11, 13 of the semiconductor fins 10, 12. The dielectric layer 20 may comprise a dielectric material, such as silicon dioxide, that is deposited by chemical vapor deposition. Sections of the dielectric layer 20 fill the cuts 16, 18 in the semiconductor fins 10, 12. The dielectric-filled cuts 16, 18 divide the semiconductor fins 10, 12 into separated sections that are disjoined and disconnected, and the dielectric material of the dielectric layer 20 inside the cuts 16, 18 electrically isolates the different fin sections.

A hardmask 22 is formed that includes openings 24, 26 that are respectively adjoined with the dielectric-filled cuts 16, 18. The openings 24, 26 overlap with and expose the dielectric layer 20 in the cuts 16, 18 of the semiconductor fins 10, 12. The hardmask 22 is comprised of a dielectric material and, in an embodiment, the hardmask 22 and the dielectric layer 20 may be comprised of the same dielectric material. In an embodiment, the hardmask 22 may be comprised of silicon dioxide that is patterned by lithography and etching processes to define the openings 24, 26. The composition of the hardmask 22 differs from conventional processes in which the hardmask is comprised of silicon nitride. The openings 24, 26 in the hardmask 22 have a length dimension, L1, and a width dimension, W1. In an embodiment, upper portions of the cuts 16, 18 at and near the top surfaces 11, 13 of the semiconductor fins 10, 12 may have a length dimension that is equal or substantially equal to the length dimension, L1, and a width dimension that is equal or substantially equal to the width dimension, W1.

Figure 4:
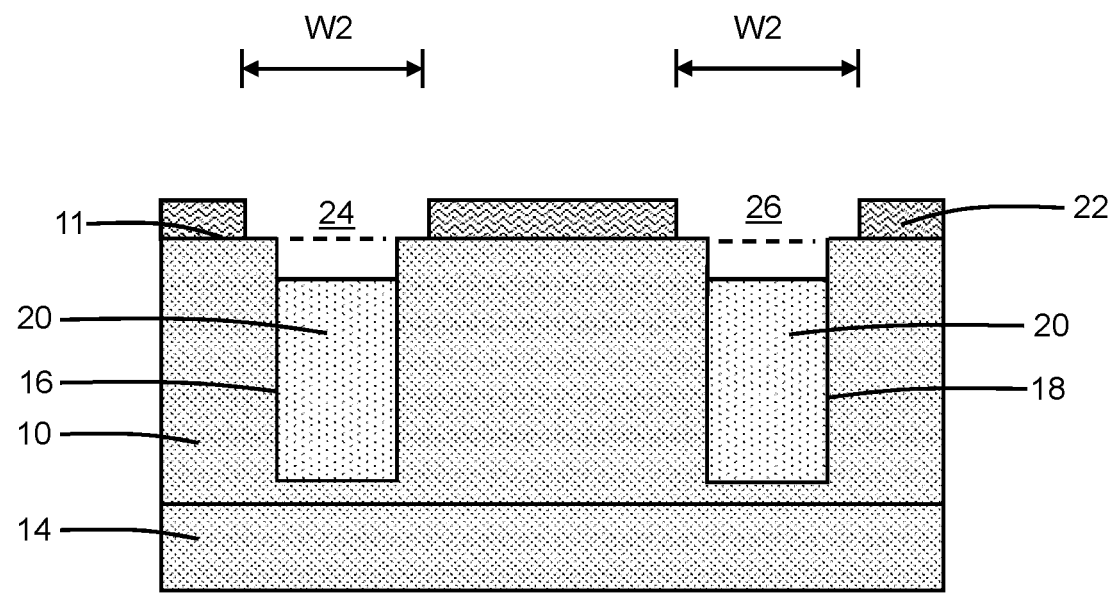
FIGS. 4, 4A are cross-sectional views of the structure at a fabrication stage of the processing method subsequent to FIGS. 3, 3A.
Figure 4A:
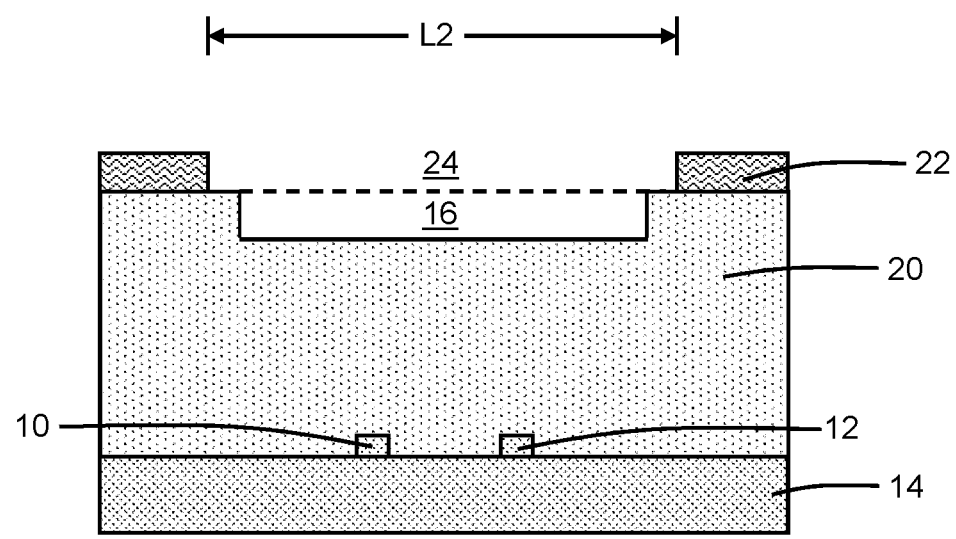

With reference to FIGS. 4, 4A in which like reference numerals refer to like features in FIGS. 3, 3A and at a subsequent fabrication stage of the processing method, the dielectric layer 20 inside the cuts 16, 18 is recessed below the top surfaces 11, 13 of the semiconductor fins 10, 12 bordering the cuts 16, 18 by an isotropic etching process characterized by lateral and vertical etching components. The dimensions of the openings 24, 26 in the hardmask 22 are increased by lateral recessing of the dielectric material during the isotropic etching process. In particular, the openings 24, 26 may be widened to a width dimension, W2, and lengthened to a length dimension, L2, by the removal of the dielectric material of the hardmask 22 at the perimeter of the openings 24, 26. The thickness of the hardmask 22 may be decreased by the isotropic etching process. The upper portions of the cuts 16, 18 that are reopened by the recessing of the dielectric layer 20 retain the length dimension, L1, that is less than the length dimension, L2, and the width dimension, W1, that is less than the width dimension, W2. Generally, width dimensions and length dimensions represent horizontal dimensions in a horizontal plane that may be parallel to a plane containing the top surfaces 11, 13 of the semiconductor fins 10, 12.

Each of the cuts 16, 18 includes a reopened upper portion from which the dielectric material of dielectric layer 20 is removed and a lower portion that contains the dielectric material of the dielectric layer 20. The upper portion of the cuts 16, 18 and the openings 24, 26 define multiple-width trenches that are located over the recessed lower portions of the dielectric layer 20 inside the respective lower portions of the cuts 16, 18. In an embodiment, these multiple-width trenches may be symmetrically located over the recessed dielectric layer 20 inside the respective lower portions of the cuts 16, 18.

Figure 5:
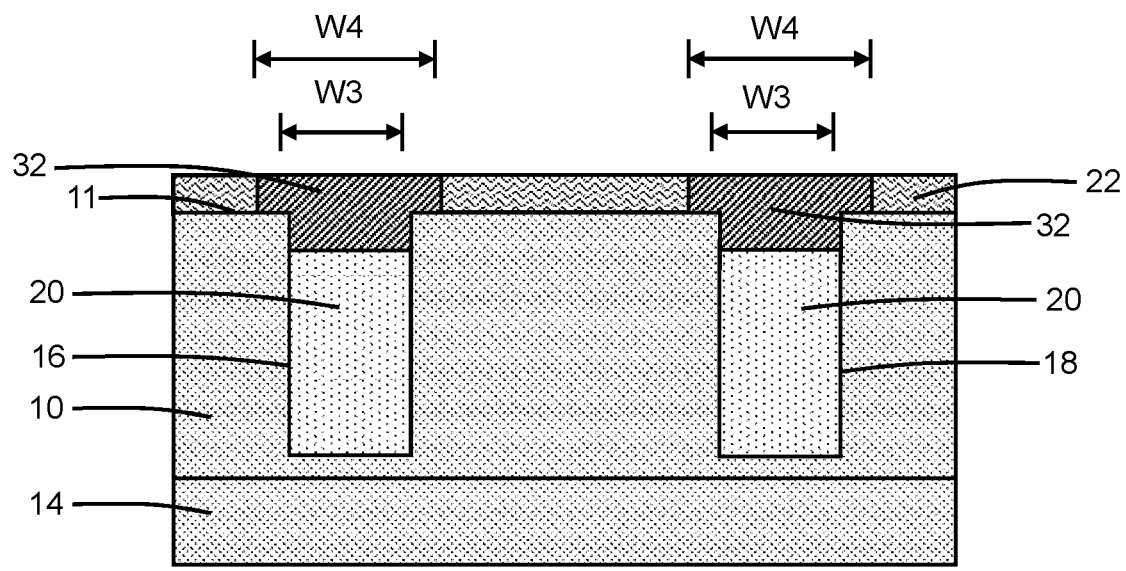
FIGS. 5, 5A are cross-sectional views of the structure at a fabrication stage of the processing method subsequent to FIGS. 4, 4A.
Figure 5A:
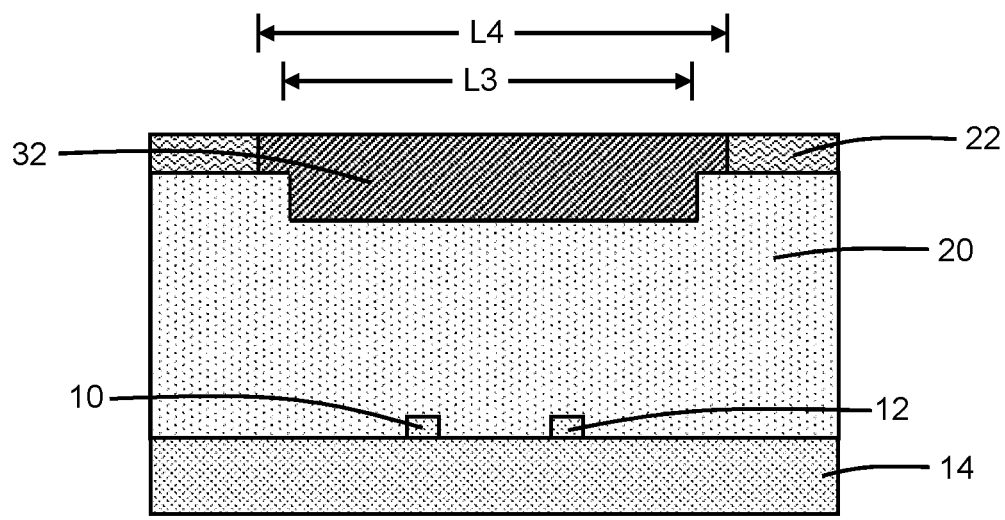

With reference to FIGS. 5, 5A in which like reference numerals refer to like features in FIGS. 4, 4A and at a subsequent fabrication stage of the processing method, a dielectric layer 32 is formed that includes sections positioned in the openings 24, 26 in the hardmask 22 and in the upper portions of the cuts 16, 18. The dielectric layer 32 may be formed by, for example, high-density-plasma chemical vapor deposition and planarized by chemical-mechanical polishing with the material of the hardmask 22 operating as a polish stop during planarization.

Each section of the dielectric layer 32 has multiple widths arising from the multiple widths of the adjoined openings 24 and reopened upper portions of cuts 16 and the multiple widths of the adjoined openings 26 and reopened upper portions of cuts 18. In particular, each section of the dielectric layer 32 has a lower portion and an upper portion that is wider and longer than the lower portion. Specifically, each section of the dielectric layer 32 has a lower portion of length, L3, and width, W3, and an upper portion of length, L4, that is greater than length, L3, and width, W4, that is greater than the width, W3. The length, L3, and width, W3 of the lower portion of each section of the dielectric layer 32 may be equal or substantially equal to the width, W1 and length, L1 (FIGS. 3, 3A). The length, L4, and width, W4 of the upper portion of each section of the dielectric layer 32 may be equal or substantially equal to the width, W2 and length, L2 (FIGS. 4, 4A).

The narrower and shorter lower portion of each section of the dielectric layer 32 is positioned over the dielectric layer 20 inside one or the other of the cuts 16, 18, and the wider and longer upper portion of each section of the dielectric layer 32 is positioned over the narrower and shorter lower portion inside one or the other of the openings 24, 26. The wider and longer upper portion of each section of the dielectric layer 32 is positioned outside of one or the other of the cuts 16, 18 and in one or the other of the openings 24, 26. The narrower and shorter lower portion of each section of the dielectric layer 32 is positioned inside one or the other of the cuts 16, 18. At its outer periphery (i.e., between the different widths), the upper portion of each section of the dielectric layer 32 is positioned in part the top surface 11 of the semiconductor fin 10 or over the top surface 13 of the semiconductor fin 12. The wider and longer upper portion of each section of the dielectric layer 32 at its outer periphery may be in direct contact with a portion of the top surface 11 of the semiconductor fin 10 or a portion of the top surface 13 of the semiconductor fin 12. The wider and longer upper portion of each section of the dielectric layer 32 may be positioned above the top surface 11 of the semiconductor fin 10 or above the top surface 13 of the semiconductor fin 12. In an embodiment, the wider and longer upper portion of each section of the dielectric layer 32 may be positioned fully above the top surface 11 of the semiconductor fin 10 or fully above the top surface 13 of the semiconductor fin 12. The narrower and shorter lower portion of each section of the dielectric layer 32 may be positioned below the top surface 11 of the semiconductor fin 10 or below the top surface 13 of the semiconductor fin 12. In an embodiment, the narrower and shorter lower portion of each section of the dielectric layer 32 may be positioned fully below the top surface 11 of the semiconductor fin 10 or fully below the top surface 13 of the semiconductor fin 12.

The dielectric layer 32 is comprised of a dielectric material having a different composition than the dielectric material of the dielectric layer 20. In an embodiment, the dielectric layer 32 may be comprised of a low-k dielectric material, such as a carbon-containing silicon nitride, such as silicon-carbon nitride (SiCN). A low-k dielectric material has a permittivity (i.e., dielectric constant) that is less than the permittivity of silicon dioxide (e.g., 3.9). In an embodiment, the dielectric materials of the hardmask 22 and the dielectric layer 32 may be selected such that the hardmask 22 is removable with an etching process selective to the dielectric material of the dielectric layer 32. As used herein, the terms "selective" and "selectivity" in reference to a material removal process (e.g., etching) denotes that the material removal rate (i.e., etch rate) for the targeted material is higher than the material removal rate (i.e., etch rate) for at least another material exposed to the material removal process.

Figure 6:
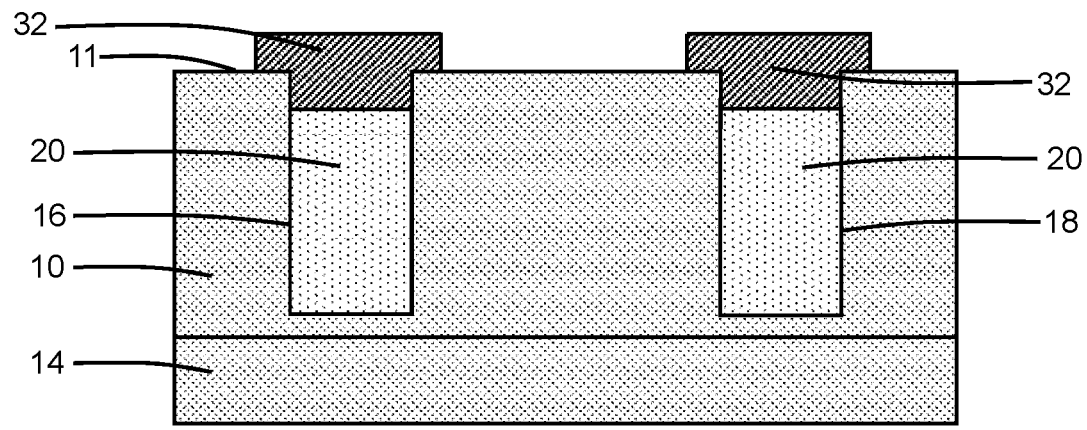
FIGS. 6, 6A are cross-sectional views of the structure at a fabrication stage of the processing method subsequent to FIGS. 5, 5A.
Figure 6A:
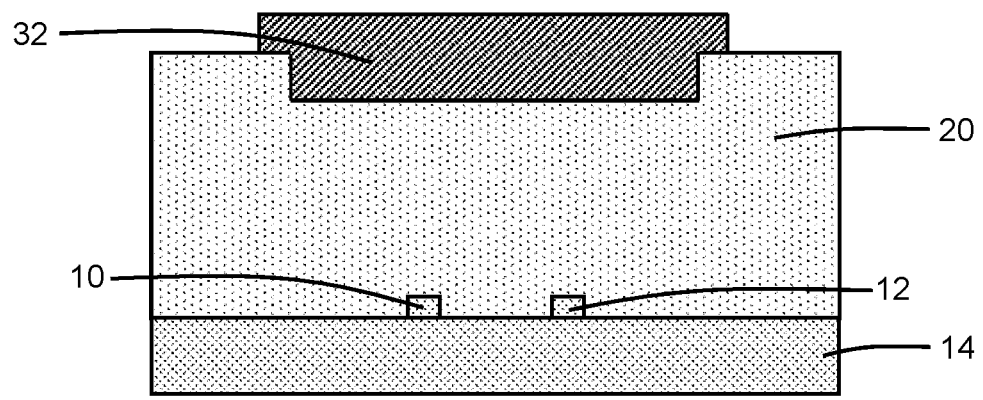

With reference to FIGS. 6, 6A in which like reference numerals refer to like features in FIGS. 5, 5A and at a subsequent fabrication stage of the processing method, the hardmask 22 is removed by an etching process that removes the hardmask 22 selective to the materials of the semiconductor fins 10, 12 and the dielectric layer 32. The selective removal of the hardmask 22 reveals the upper portion of each section of the dielectric layer 32. The dielectric layer 20 surrounding the semiconductor fins 10, 12 may also be recessed by the etching process to reveal an upper portion of each of the semiconductor fins 10, 12. A lower portion of each of the semiconductor fins 10, 12 is surrounded by the recessed dielectric material of the dielectric layer 20 to define shallow trench isolation region. In an embodiment, a single etching process, such as a chemical oxide removal (COR) process, may be employed to provide a fin reveal in which the upper portions of the semiconductor fins 10, 12 exhibit reduced erosion and rounding resulting in a more rectangular profile for the upper fin portions. The sections of the dielectric layer 32, which do not contain silicon dioxide, are not significantly eroded during the fin reveal, which promotes the use of the single etching process.

The reduction in fin rounding may improve the performance of a field-effect transistor formed using the semiconductor fins 10, 12. For example, the reduction in fin rounding may improve the effective channel width of a field-effect transistor formed using the semiconductor fins 10, 12. Fin variations from etch loading effects may also be reduced, which may in turn reduce variations in fin height during the fin reveal. In addition, the reduction in fin erosion may also improve the isolation margin.

Figure 7:
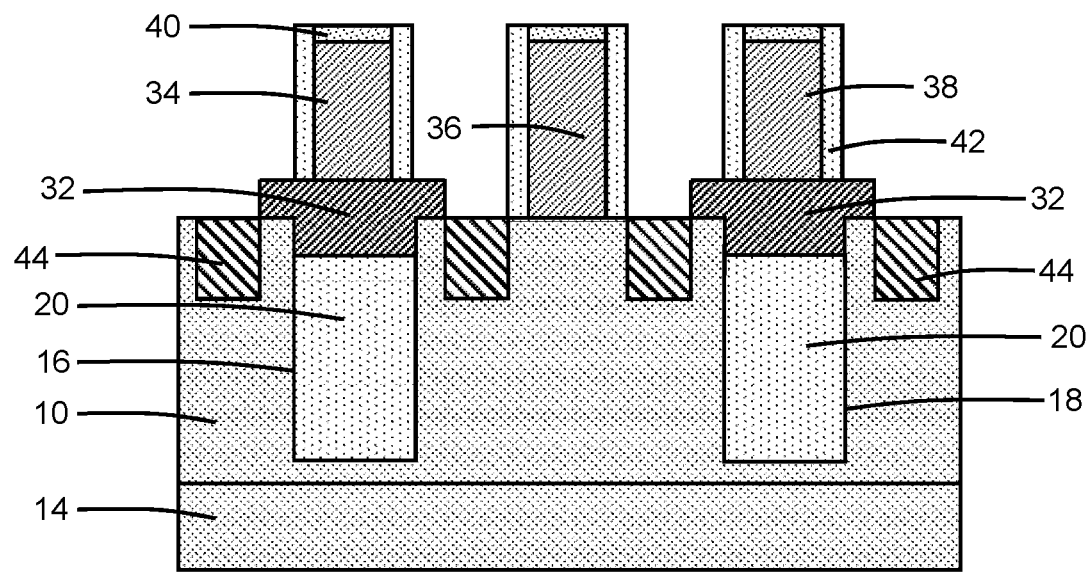
FIGS. 7, 7A are cross-sectional views of the structure at a fabrication stage of the processing method subsequent to FIGS. 6, 6A.
Figure 7A:
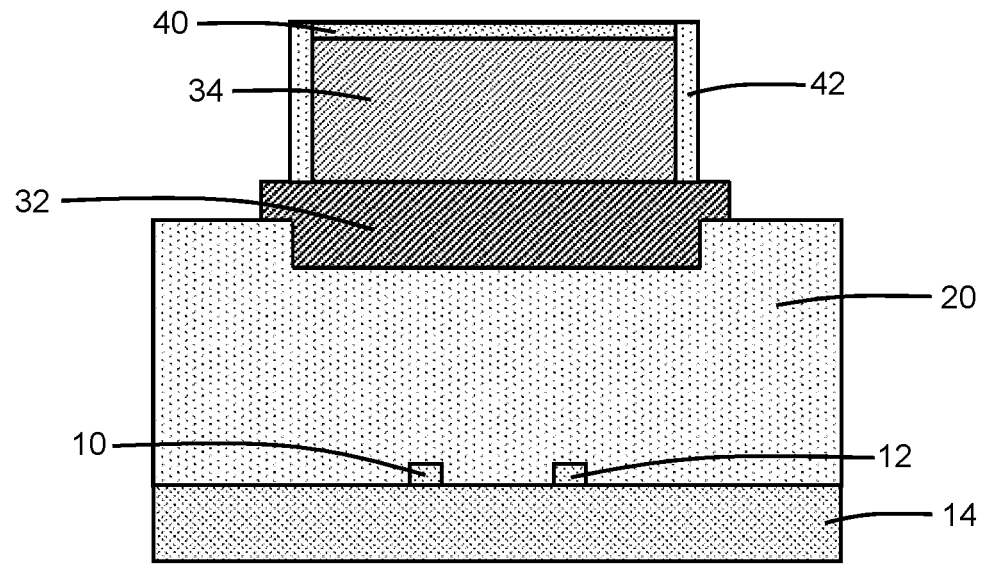

With reference to FIGS. 7, 7A in which like reference numerals refer to like features in FIGS. 6, 6A and at a subsequent fabrication stage of the processing method, gate structures 34, 36, 38 are formed that extend along respective longitudinal axes over and across the semiconductor fins 10, 12. Each of the gate structures 34, 36, 38 is arranged transverse to the semiconductor fins 10, 12 and overlaps with, and wraps about, respective sections (e.g., channel regions) of the semiconductor fins 10, 12. The gate structures 34, 36, 38 are also arranged in part on the top surface of portions of the dielectric layer 20 between the semiconductor fins 10, 12 and adjacent to the semiconductor fins 10, 12.

The gate structures 34, 36, 38 have a spaced-apart arrangement along the respective longitudinal axes of the semiconductor fins 10, 12. The gate structures 34, 36, 38 may be formed by depositing a layer of a material, such as polycrystalline silicon, and then patterning this deposited layer with lithography and etching processes. A thin dielectric layer comprised of, for example, silicon dioxide, may be arranged between the semiconductor fins 10, 12 and the gate structures 34, 36, 38.

Sidewall spacers 42 are positioned adjacent to the sidewalls of the gate structures 34, 36, 38. The sidewall spacers 42 may be formed by depositing a conformal layer comprised of a dielectric material, such as silicon dioxide, and etching the deposited layer with an anisotropic etching process, such as reactive ion etching. A gate cap 40 comprised of a dielectric material, such as silicon nitride, is positioned over each of the gate structures 34, 36, 38.

Source/drain regions 44 are formed within cavities defined in the semiconductor fins 10, 12 at locations between the spacer-clad gate structures 34, 36, 38. As used herein, the term "source/drain region" means a doped region of semiconductor material that can function as either a source or a drain of a field-effect transistor. The source/drain regions 44 may be formed by the epitaxial growth of a semiconductor material from surfaces of the semiconductor fins 10, 12 surrounding the cavities, and their formation may follow the formation of the gate structures 34, 36, 38 to provide self-alignment. The source/drain regions 44 may contain an n-type dopant (e.g., phosphorus and/or arsenic) that provides n-type conductivity. Alternatively, the source/drain regions 44 may contain a p-type dopant (e.g., boron) that provides p-type conductivity. Although not shown, the width and length of the upper portion of each section of the dielectric layer 32 may be reduced by the etching process forming the cavities used during epitaxial growth.

The epitaxial semiconductor material of the source/drain regions 44 may be optimized by the structure 60 that includes single diffusion breaks provided by the heterogenous combination of the stacked sections of the dielectric layers 20, 32. In particular, the epitaxial semiconductor material contained in the source/drain regions 44 may be taller and more planar than the epitaxial semiconductor material contained in source/drain regions formed adjacent to conventional single diffusion breaks comprised of only a single dielectric material. The flatter and taller source/drain regions 44 may improve faceting issues and may also improve the landing of trench silicide contacts on the epitaxial semiconductor material during subsequent middle-of-line processing.

Figure 8:
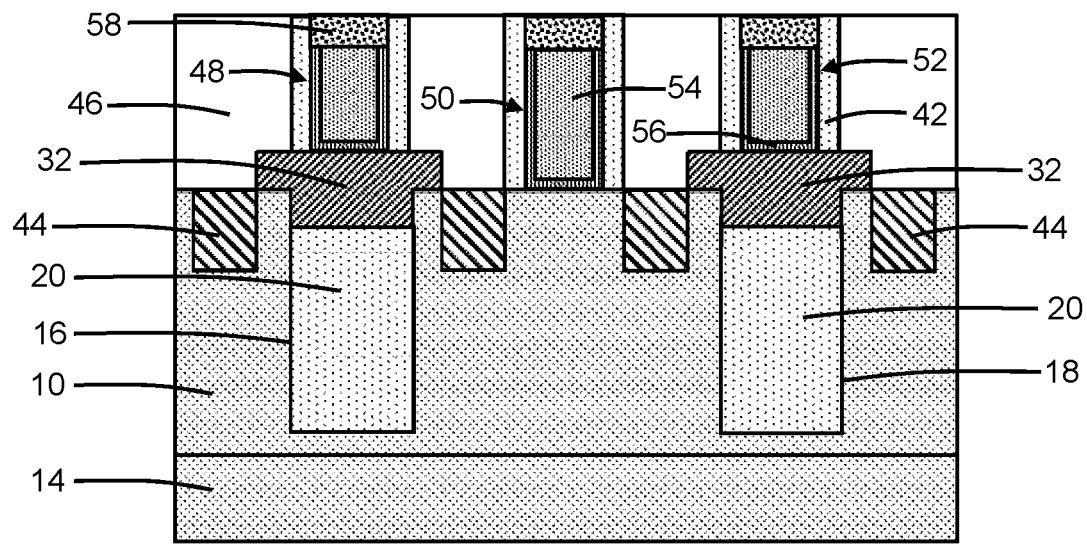
FIGS. 8, 8A are cross-sectional views of the structure at a fabrication stage of the processing method subsequent to FIGS. 7, 7A.
Figure 8A:
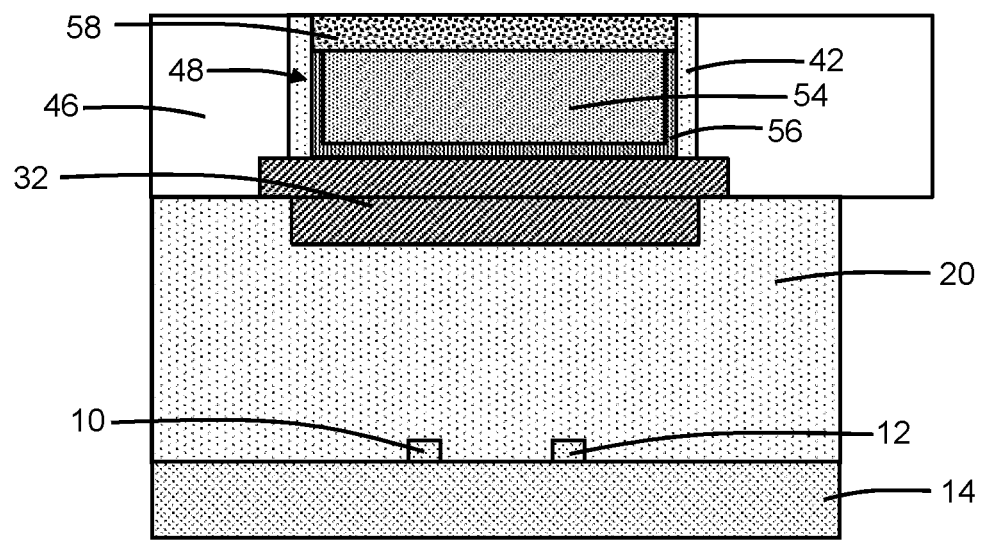

With reference to FIGS. 8, 8A in which like reference numerals refer to like features in FIGS. 7, 7A and at a subsequent fabrication stage of the processing method, an interlayer dielectric layer 46 is formed that includes sections arranged over the source/drain regions 44. The interlayer dielectric layer 46 may be comprised of a dielectric material, such as silicon dioxide, that is deposited, for example, by chemical vapor deposition and planarized, for example, by chemical vapor deposition. Prior to forming the interlayer dielectric layer 46, a contact etch-stop layer (not shown) comprised of a thin conformal layer of a dielectric material, such as silicon nitride, may be deposited that provides a liner between the sections of the interlayer dielectric layer 46 and the source/drain regions 44.

The gate structures 34, 36, 38 and their gate caps 40 may be removed as part of a replacement metal gate process, and gate structures 48, 50, 52 may be formed in the spaces opened by their removal. Each of the gate structures 48, 50, 52 may include a gate electrode 54 and a gate dielectric 56. The gate electrode 54 may include one or more conformal barrier metal layers and/or work function metal layers, and the gate dielectric 56 may be comprised of a high-k dielectric material, such as hafnium oxide. Self-aligned contact caps 58 comprised of a dielectric material, such as silicon nitride, may be formed over the gate structures 48, 50, 52.

The gate structure 50 is positioned over a fin channel region located between adjacent source/drain regions 44. The gate structure 50 may be biased during operation to provide the functionality of the field-effect transistor. The gate structures 48 and 52 are positioned over stacked sections of the dielectric layer 32 and the dielectric layer 20 residing in each of the fin cuts 16, 18. The stacked sections of the dielectric layer 32 and the dielectric layer 20 define single diffusion breaks, and the gate structures 48 and 52 represent dummy gates that are not electrically-active components of the field-effect transistor.

Middle-of-line (MOL) processing and back-end-of-line (BEOL) processing follow, which includes formation of silicide, contacts, vias, and wiring for an interconnect structure coupled with the field effect transistor.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a semiconductor fin including a cut and a top surface; and
   a single diffusion break including a first dielectric layer in the cut and a second dielectric layer over the first dielectric layer, the first dielectric layer comprised of a first material, the second dielectric layer comprised of a second material having a different composition than the first material, the second dielectric layer including a first portion over the first dielectric layer and a second portion over the first portion, the first portion of the second dielectric layer positioned inside of the cut, the second portion of the second dielectric layer positioned in part over the top surface of the semiconductor fin, the second portion of the second dielectric layer in direct contact with a portion of the top surface of the semiconductor fin, the first portion of the second dielectric layer having a first horizontal dimension, and the second portion of the second dielectric layer having a second horizontal dimension that is greater than the first horizontal dimension.

2. The structure of claim 1 wherein the first material is silicon dioxide, and the second material is a low-k dielectric material.

3. The structure of claim 1 wherein the first material is silicon dioxide, and the second material is carbon-containing silicon nitride.

4. The structure of claim 1 wherein the second portion of the second dielectric layer is positioned outside of the cut.

5. The structure of claim 1 wherein the second portion of the second dielectric layer is fully positioned above the top surface of the semiconductor fin.

6. The structure of claim 1 wherein the first portion of the second dielectric layer is positioned in the cut below the top surface of the semiconductor fin.

7. The structure of claim 1 wherein the first portion of the second dielectric layer is fully positioned in the cut below the top surface of the semiconductor fin.

8. The structure of claim 1 wherein the first horizontal dimension of the first portion of the second dielectric layer is a first width, the second horizontal dimension of the second portion of the second dielectric layer is a second width, the first portion of the second dielectric layer has a first length transverse to the first width, the second portion of the second dielectric layer has a second length transverse to the second width, and the second length is greater than the first length.

9. The structure of claim 8 wherein the first portion of the second dielectric layer is positioned in the cut below the top surface of the semiconductor fin, and the second portion of the second dielectric layer is fully positioned above the top surface of the semiconductor fin.

10. The structure of claim 8 wherein the second portion of the second dielectric layer is positioned outside of the cut.

11. The structure of claim 1 further comprising:
    a first gate structure extending across the single diffusion break.

12. The structure of claim 11 further comprising:
    a second gate structure extending across the semiconductor fin adjacent to the first gate structure.

13. The structure of claim 12 further comprising:
    an epitaxial semiconductor layer coupled to the semiconductor fin, the epitaxial semiconductor layer laterally positioned between the first gate structure and the second gate structure.

14. A structure comprising:
    a semiconductor fin including a cut;
    a single diffusion break including a first dielectric layer in the cut and a second dielectric layer over the first dielectric layer, the first dielectric layer comprised of a first material, the second dielectric layer comprised of a second material having a different composition than the first material, the second dielectric layer including a first portion over the first dielectric layer and a second portion over the first portion, the first portion of the second dielectric layer having a first horizontal dimension, and the second portion of the second dielectric layer having a second horizontal dimension that is greater than the first horizontal dimension; and a first gate structure extending across the single diffusion break.

15. The structure of claim 14 further comprising:
a second gate structure extending across the semiconductor fin adjacent to the first gate structure.

16. The structure of claim 15 further comprising:
an epitaxial semiconductor layer coupled to the semiconductor fin, the epitaxial semiconductor layer laterally positioned between the first gate structure and the second gate structure.

17. The structure of claim 14 wherein the first horizontal dimension of the first portion of the second dielectric layer is a first width, the second horizontal dimension of the second portion of the second dielectric layer is a second width, the first portion of the second dielectric layer has a first length transverse to the first width, the second portion of the second dielectric layer has a second length transverse to the second width, and the second length is greater than the first length.

18. The structure of claim 14 wherein the first material is silicon dioxide, and the second material is carbon-containing silicon nitride.

19. A method comprising:
forming a cut in a semiconductor fin; and
forming a single diffusion break including a first dielectric layer in the cut and a second dielectric layer over the first dielectric layer, wherein the first dielectric layer is comprised of a first material, the second dielectric layer is comprised of a second material having a different composition than the first material, the second dielectric layer includes a first portion over the first dielectric layer and a second portion over the first portion, the first portion of the second dielectric layer has a first horizontal dimension, and the second portion of the second dielectric layer has a second horizontal dimension that is greater than the first horizontal dimension, and wherein forming the single diffusion break including the first dielectric layer in the cut and the second dielectric layer over the first dielectric layer comprises:

depositing the first dielectric layer inside the cut;

forming a hardmask including an opening positioned over the cut;

recessing the first dielectric layer inside the cut and relative to a top surface of the semiconductor fin with an isotropic etching process; and widening the opening in the hardmask with the isotropic etching process.

20. The method of claim 19 wherein forming the single diffusion break including the first dielectric layer in the cut and the second dielectric layer over the first dielectric layer further comprises:

depositing the second dielectric layer inside the cut in the semiconductor fin and inside the widened opening in the hardmask; and removing the hardmask with an etching process.

* * * * *